US008464106B2

(12) United States Patent
Filor et al.

(10) Patent No.: US 8,464,106 B2
(45) Date of Patent: Jun. 11, 2013

(54) COMPUTER SYSTEM WITH BACKUP FUNCTION AND METHOD THEREFOR

(75) Inventors: Lutz Filor, San Jose, CA (US); Franz Michael Schuette, Colorado Springs, CO (US)

(73) Assignee: OCZ Technology Group, Inc., San Jose, CA (US)

( * ) Notice: Subject to any disclaimer, the term of this patent is extended or adjusted under 35 U.S.C. 154(b) by 170 days.

(21) Appl. No.: 13/027,597

(22) Filed: Feb. 15, 2011

(65) Prior Publication Data

US 2011/0173378 A1 Jul. 14, 2011

Related U.S. Application Data

(63) Continuation-in-part of application No. 12/986,564, filed on Jan. 7, 2011, which is a continuation-in-part of application No. 12/862,176, filed on Aug. 24, 2010.

(60) Provisional application No. 61/304,885, filed on Feb. 16, 2010, provisional application No. 61/293,257, filed on Jan. 8, 2010, provisional application No. 61/236,169, filed on Aug. 24, 2009.

(51) Int. Cl.
 *G11C 29/00* (2006.01)
(52) U.S. Cl.
 USPC .......................................................... 714/723
(58) Field of Classification Search
 USPC .......................................................... 714/723
 See application file for complete search history.

(56) References Cited

U.S. PATENT DOCUMENTS

| 5,632,012 | A | 5/1997 | Belsan et al. |
| 6,292,869 | B1 | 9/2001 | Gerchman et al. |
| 6,848,063 | B2 | 1/2005 | Rodeheffer et al. |
| 7,277,246 | B2 * | 10/2007 | Barbian et al. ................... 360/69 |
| 8,001,318 | B1 * | 8/2011 | Iyer et al. ....................... 711/103 |
| 8,341,332 | B2 * | 12/2012 | Ma et al. ......................... 711/103 |
| 2002/0162075 | A1 | 10/2002 | Talagala |
| 2008/0276038 | A1 * | 11/2008 | Tanaka et al. .................. 711/103 |
| 2010/0246266 | A1 * | 9/2010 | Park et al. ................. 365/185.11 |
| 2011/0131444 | A1 * | 6/2011 | Buch et al. ....................... 714/6.1 |
| 2011/0252289 | A1 * | 10/2011 | Patapoutian et al. ......... 714/763 |
| 2011/0271046 | A1 * | 11/2011 | Iyer et al. ....................... 711/103 |

* cited by examiner

*Primary Examiner* — Amine Riad
(74) *Attorney, Agent, or Firm* — Hartman Global IP Law; Gary M. Hartman; Domenica N. S. Hartman (57) ABSTRACT

A solid-state mass storage device and method of anticipating a failure of the mass storage device resulting from a memory device of the mass storage device reaching a write endurance limit. A procedure is then initiated to back up data to a second mass storage device prior to failure. The method includes assigning at least a first memory block of the memory device as a wear indicator, using other memory blocks of the memory device as data blocks for data storage, performing program/erase (P/E) cycles and wear leveling on the data blocks, subjecting the wear indicator to more P/E cycles than the data blocks, performing integrity checks and monitoring the bit error rate of the wear indicator, and taking corrective action if the bit error rate increases, including the initiation of the backup procedure and generating a request to replace the device.

25 Claims, 4 Drawing Sheets

COMPUTER SYSTEM WITH BACKUP FUNCTION AND METHOD THEREFOR

CROSS REFERENCE TO RELATED APPLICATIONS

This application claims the benefit of U.S. Provisional Application No. 61/304,885, filed Feb. 16, 2010, the contents of which are incorporated herein by reference. In addition, this application is a continuation-in-part patent application of copending U.S. patent application Ser. Nos. 12/862,176 and 12/986,564, which claim the benefit of U.S. patent application Ser. Nos. 61/236,169 and 61/293,257, respectively. The contents of these applications are also incorporated herein by reference.

BACKGROUND OF THE INVENTION

The present invention generally relates to memory devices for use with computers and other processing apparatuses. More particularly, this invention relates to nonvolatile-based (permanent memory-based) mass storage devices that use flash memory devices or any similar nonvolatile memory devices for permanent storage of data. The mass storage devices are characterized by memory blocks allocated for use to anticipate device failure before a critical threshold of endurance limitation is reached, and automatically initiate a backup of stored data to a secondary storage device prior to reaching the critical threshold.

Mass storage devices such as advanced technology attachments (ATA), Serial ATA (SATA), small computer system interface (SCSI) drives, Serially attached SCSI (SAS) and advanced serial interfaces such as USB 2.0, USB 3.0 and Gigabit-Ethernet-based solid state drives (SSD) are rapidly adopting nonvolatile memory technology such as flash memory or other emerging solid-state memory technology, including phase change memory (PCM), resistive random access memory (RRAM), magnetoresistive random access memory (MRAM), ferromagnetic random access memory (FRAM), organic memories, and nanotechnology-based storage media such as carbon nanofiber/nanotube-based substrates. Currently the most common technology uses NAND flash memory as inexpensive storage memory.

Endurance and data retention limitations that are inherent to the design and function of NAND flash technology are becoming increasingly more problematic for use of this technology in solid-state drives. Briefly, flash memory components store information in an array of floating-gate transistors, referred to as cells. NAND flash cells are organized in what are commonly referred to as pages, which in turn are organized in predetermined sections of the component referred to as memory blocks (or sectors). Each cell of a NAND flash memory component has a top gate (TG) and a floating gate (FG), the latter being sandwiched between the top gate and the channel of the cell. The floating gate is separated from the channel by a layer of tunnel oxide. Data are stored in a NAND flash cell in the form of a charge on the floating gate which, in turn, defines the channel properties of the NAND flash cell by either augmenting or opposing the charge of the top gate. This charge on the floating gate is achieved by applying a programming voltage to the top gate. The process of programming (writing 0's to) a NAND cell requires the injection of electrons into the floating gate by quantum mechanical tunneling, whereas the process of erasing (writing 1's to) a NAND cell requires applying an erase voltage to the device substrate, which then pulls electrons from the floating gate. Programming and erasing NAND flash cells is an extremely harsh process utilizing electrical fields in excess of 10 million V/cm to move electrons through the tunnel oxide layer.

The brute force approach used to program and erase NAND flash results in wear and fatigue of the cells by causing atomic bond sites in the tunnel oxide layer to break. The broken-bond sites then become a trap for electrons that mimic charges in the floating gate, which can cause false data to be read from the NAND flash cells or prevent correct erasure of the cells. In the case of single level cells, where only one bit is stored per cell, the trapping of electrons is a relatively minor issue that gradually increases to a critical threshold over tens of thousands of program and erase (P/E) cycles. However, in the case of multilevel cells (MLC) that use, for example, four different levels to encode two bits per cell, the "drift" in charge caused by a steady build-up of electrons in the tunnel oxide layer and at the borders between the layers constitutes the predominant limitation of write endurance (which as used herein refers to the number of P/E cycles beyond which a solid-state memory device may become unreliable). Using 50 nm process technology as an example, MLC NAND flash memory is expected to sustain approximately 10,000 P/E cycles per cell before reaching the endurance limitation caused by degradation of the tunnel oxide layer. Data retention dramatically declines with every reduction in process geometry because of proximity effects, in particular, stress-induced leakage current (SILO), which refers to the release of electrons from the floating gate caused by erasure of a nearby block. For example, for a 3× nm process, typical write endurance is on the order of about 3000 to 5000 P/E cycles per cell, and for a 22 nm process write endurance estimates decrease toward about 900 to about 1200 P/E cycles per cell.

The life cycle of any solid-state drive is determined by its weakest component. Once individual blocks start to develop unrecoverable bit error rates (UBER) leading to data loss, the entire SSD has reached its end of life. In this context, one must consider that NAND flash is a form of memory and favors similar grouping of coherent data, known in DRAM and SRAM technology as data locality. Consequently, in the absence of any additional management, flash memory would develop a few "high traffic" islands while the rest of the array would be underutilized. Both functional scenarios are far from optimal since high traffic areas are exposed to excessive wear and will, therefore, reach their endurance limitation ahead of the rest of the drive, whereas some very low traffic areas will never see a data update and, therefore, develop leakage current-based data retention loss.

In order to avoid excessive wear of a small number of flash blocks, a technology called wear leveling has been implemented. Early generations of NAND flash-based solid-state drives used relatively primitive and unsophisticated mechanisms of wear-leveling based on regional schemes. As a result, a spread of usage of up to 20× between low usage and high usage blocks was common. Modern controllers use more sophisticated wear-leveling algorithms, with the result that differences between highest and lowest usage of blocks are often less than 0.5%. This number is expected to further decline with future generations of SSD controllers.

Modern SSDs also use a technique called "Over-Provisioning" (OP), in which the accessible amount of memory blocks allowed by the controller is less than the physical amount of memory blocks present in the array. For example, an SSD with 64 GB of physical memory can be over-provisioned to only allow 80% of its memory space to be used by the system and therefore appear as a 51 GB SSD. The 13 GB of over-provisioned memory blocks is treated as reserve and will not be used for data storage. However, the over-provisioned memory blocks can be used for temporary storage and shuffled in and out of the OP "pool" on demand, as long as they are replaced immediately by empty blocks.

Another media management technique is bad-block management. Unlike the case of SDRAM, flash memory is not a "perfect" storage media but has bad blocks in every chip. Bad blocks are typically recognized by error checking and correction (ECC) mechanisms and flagged to be excluded from use for data storage. Another mechanism for integrity check is signature comparison. Bad-block management can also include blocks that are spontaneously failing as a function of wear.

One of the biggest challenges with SSDs is the prediction of device failure. In conventional hard disc drives, failure rates are additive, that is, there is a linear relation between the number of program and erase accesses and the number of failures. As a drive ages, failures and bad blocks will increase accordingly. In the case of SSDs, the situation is different in that SSDs will function without failures up to a certain threshold followed by an exponential increase of failures over a relatively small increase in usage. However, environmental factors, including usage patterns and temperature variations, also change the behavior of SSDs. Because of changes in chip design and even minor variability in quality, as well as the mentioned environmental factors contributing to the aging process of NAND flash, it is extremely difficult to predict the onset of the exponential increase in UBER and, by extension, predict the sudden death of an SSD.

The phenomenon of sudden death is not a problem that occurs from one moment to the next. Rather it is the accumulation of unrecoverable errors that reaches a critical threshold or the corruption of data that are critical to the SSD's functionality. In most cases, an increase in correctable bit error rates (BER) could be used as a trigger to stop any write access that would result in exceeding the threshold towards a catastrophic failure. However, recoverable bit errors are remedied on the level of the SSD as part of its normal operation and without the host system (for example, a computer) being aware of the errors.

Copending U.S. patent application Ser. Nos. 12/862,176 and 12/986,564 disclose the use of dedicated blocks or pages of memory to anticipate failure of an SSD by subjecting those blocks or pages to a load pattern above the mean P/E cycles to which data blocks of the SSD are subjected. This anticipatory mode of failure prediction is based on the notion that, with modern wear-leveling, failure accumulation will start at a narrow range of P/E cycles. By itself, however, failure prediction does not solve the issue of potential data loss.

BRIEF DESCRIPTION OF THE INVENTION

The present invention provides a solid-state mass storage device for use with host systems, including computers and other processing apparatuses, and a method of operating the storage device to automatically predetermine a failure of the storage device resulting from a write endurance limitation being reached for one or more memory devices of the storage device. The operation of the storage device is then suspended with enough margin to allow recovery and backup of data to another mass storage device of the host system.

According to a first aspect of the invention, the mass storage device has a controller and at least one nonvolatile memory device comprising pages that are organized into memory blocks. The method includes assigning at least a first memory block of the memory blocks as wear indicator means, and excluding the wear indicator means from use as data storage for the nonvolatile memory device. Furthermore, at least a first set of the memory blocks of the nonvolatile memory device is used as data blocks for data storage, whereby data are written to and erased from each of the data blocks in program/erase (P/E) cycles. The method further includes collecting information regarding the number of P/E cycles encountered by the data blocks and accessing the information to perform wear leveling on the data blocks. The wear indicator means is subjected to P/E cycles so that the wear indicator means is subjected to a number of P/E cycles that is greater than the number of P/E cycles encountered by the data blocks, integrity checks of the wear indicator means are performed, a bit error rate thereof is monitored, and corrective action is taken if the bit error rate of the wear indicator means increases. The corrective action includes connecting the first solid-state mass storage device to a second mass storage device of the host system, and then initiating a data backup procedure comprising copying to the second mass storage device all data stored in the data blocks of the first solid-state mass storage device.

According to a second aspect of the invention, a computer host system is provided that is adapted to perform automatic backup of a first solid-state mass storage device to a second mass storage device using automatic predetermination of a failure of the first solid-state mass storage device. The first solid-state mass storage device includes a controller and at least one nonvolatile memory device comprising pages that are organized into memory blocks. At least a first memory block of the memory blocks is assigned as wear indicator means and is excluded from use as data storage for the nonvolatile memory device. At least a first set of the memory blocks of the nonvolatile memory device is used as data blocks for data storage, whereby data are written to and erased from each of the data blocks in program/erase (P/E) cycles. The first solid-state mass storage device is further adapted to perform wear leveling to maintain substantially the same level of usage across the data blocks, subject the wear indicator means to P/E cycles so that the wear indicator means is subjected to a number of P/E cycles that is greater than the number of P/E cycles encountered by the data blocks, and perform integrity checks of the wear indicator means by monitoring a bit error rate thereof. The computer host system further is further adapted to take corrective action if the bit error rate of the wear indicator means increases. The corrective action includes connecting the first solid-state mass storage device to the second mass storage device, and initiating a data backup procedure that comprises copying to the second mass storage device all data stored in the data blocks of the first solid-state mass storage device.

A technical effect of the invention is the ability to prevent the loss of data stored on a solid-state mass storage device by automatically initiating a data backup procedure prior to a failure of the mass storage device that would result from a memory device of the mass storage device reaching its write endurance limitation. The ability to predict the fatigue threshold of a solid-state mass storage device is achieved by assigning (flagging) specific pages and/or blocks of its memory devices as wear indicators, and then subjecting these wear indicators to a higher rate of P/E cycles than blocks used to conventionally store data on the same memory devices. By subjecting the wear indicators to a higher wear rate in this manner, an earlier onset of unrecoverable bit error rates (UBER) will likely occur in the wear indicators than in the data blocks. In this manner, the invention is able to provide a wear indicator-based test-ahead feature that is capable of reliably anticipating device failure, and the capability of doing so independent of variations in design and environmental parameters.

Other aspects and advantages of this invention will be better appreciated from the following detailed description.

DETAILED DESCRIPTION OF THE INVENTION

Figure 1:
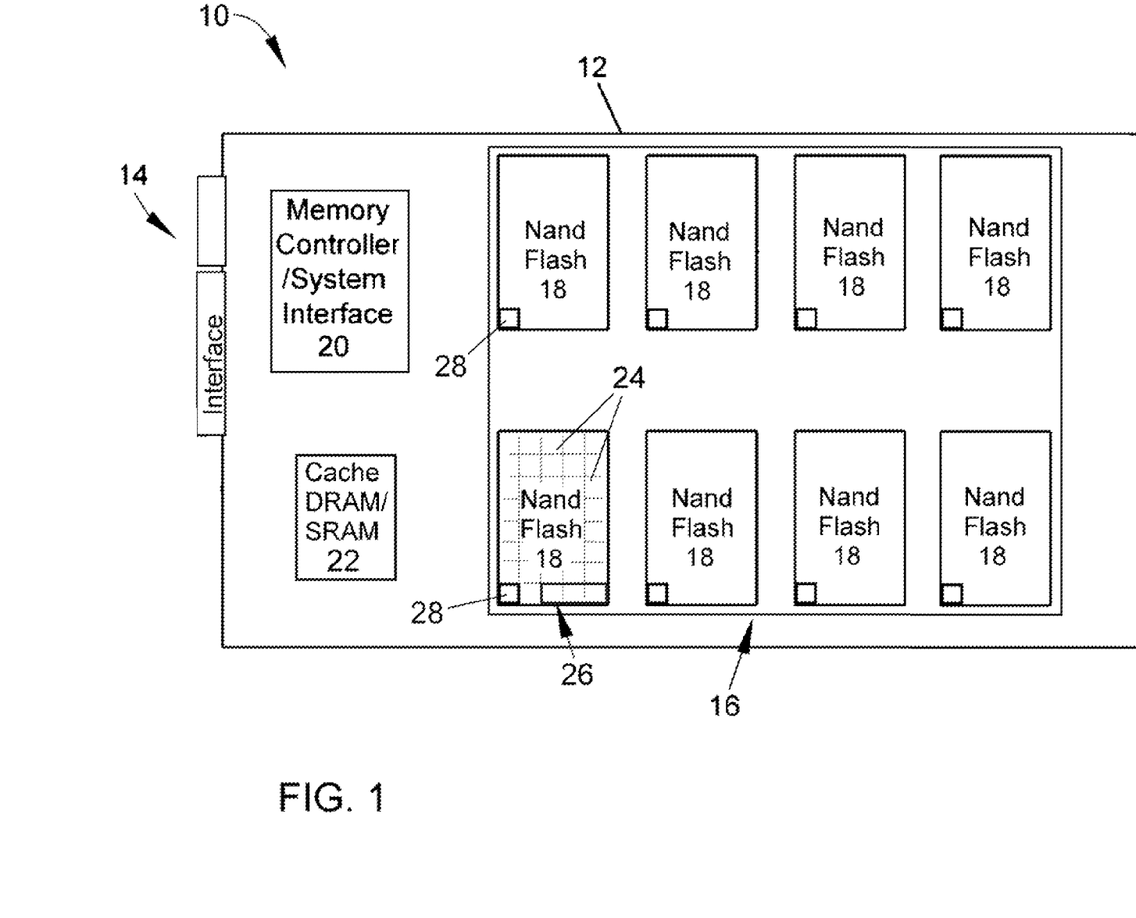
FIG. 1 is a schematic representation of a flash memory-based (solid-state) mass storage device with a plurality of NAND flash memory devices, each containing a wear-indicator block for assessing the state of wear of the memory devices in accordance with a preferred aspect of the invention.

The present invention is generally applicable to computers and other processing apparatuses (host systems), and particularly to computers and apparatuses that utilize nonvolatile (permanent) memory-based mass storage devices, a notable example of which are solid-state drives (SSDs) that make use of NAND flash memory devices. FIG. 1 is schematically representative of such a SSD 10, though it should be understood that mass storage devices utilizing nonvolatile memory devices and having other than the classic "drive" form factor are also within the scope of this invention. The SSD 10 is represented as being configured as an internal mass storage device for a computer or other host system (not shown) equipped with a data and control bus for interfacing with the SSD 10. The bus may operate with any suitable protocol in the art, preferred examples being the advanced technology attachment (ATA) bus in its parallel or serial iterations, fiber channel (FC), small computer system interface (SCSI), and serially attached SCSI (SAS), as well as direct PCI (peripheral component interconnect) and PCIe (PCI Express) access.

As known in the art, the SSD 10 is adapted to be accessed by the host system with which it is interfaced. In FIG. 1, this interface is through a connector (host) interface 14 carried on a drive package that includes a printed circuit board 12. Access is initiated by the host system for the purpose of storing (writing) data to (programming) and retrieving (reading) data from an array 16 of solid-state nonvolatile memory devices 18, each being an integrated circuit (IC) chip carried on the circuit board 12. According to a preferred aspect of the invention represented in FIG. 1, the memory devices 18 are NAND flash memory devices 18 that allow data to be stored, retrieved and erased on a block-by-block basis. FIG. 1 schematically represents memory blocks 24 located within multiple predetermined sections of one of the memory devices 18, though it should be understood that memory blocks 24 are present within each memory device 18 of the SSD 10. The memory devices 18 are preferably accessed in parallel by a memory controller/system interface (controller) 20, through which data pass when being written to and read from the memory devices 18. The controller 20 may comprise, for example, a host bus interface decoder and a memory controller capable of addressing the array 16 of memory devices 18. Protocol signals received through the interface 14 are translated by an abstraction layer of the controller 20 from logical to physical addresses on the memory devices 18 to which the data are written or from which they are read. The controller 20 also addresses a volatile memory cache chip 22 integrated on the SSD 10. The cache chip 22 may be, for example, DRAM or SRAM-based, as known in the art. Alternatively, the cache memory of the SSD 10 may be integrated on the controller 20, as also known in the art.

By using a relatively sophisticated wear-leveling technique of a type currently available, the controller 20 of the SSD 10 is able to monitor the number of accesses to any given block 24 in each memory device 18 of the memory array 16, store the data in a dedicated "house-keeping" portion of each memory device 18, and then select blocks 24 with fewer reprogram/erase cycles for the next storage of data. The effect is that the access traffic to the memory array 16 can be evenly distributed over all blocks 24 by using an erase counter to monitor the erase cycles that precede any rewriting of data. The controller 20 is aware of how many times each block 24 has been programmed and erased (P/E cycles), and uses the blocks 24 with the least number of P/E cycles for the next data write cycle. Consequently, all blocks 24 within each NAND flash memory device 18, and by extension, the entire SSD 10, are subjected to the same number of P/E cycles, with only minor disparities in the overall number of P/E cycles. Moreover, such disparities are largely caused by the utilization patterns of the parallel channels interfacing with the memory array 16, and are transient, meaning that any given workload is usually optimized for performance and, as long as this workload is executed, it will result in temporary "over-usage" of specific localities within the array 16. However, this temporary effect is typically counteracted with the next set of transfers as a function of wear leveling.

Because of the effects of wear leveling, it is fair to assume that any block 24 within the array 16 is largely representative of the overall state of endurance or fatigue of any other block 24 within the array 16, which includes memory blocks 24 within over-provisioning (OP) pools 26 of each memory device 18. Memory blocks 24 of OP pools 26 will be subjected to the same usage patterns as any other block 24 of a memory device 18, with the main differentiating factor that there will always have to be a reserve. Even with only marginal over-provisioning, the SSD 10 will have blocks 24 to spare at any time. At the same time, over-provisioning does not permanently identify individual blocks 24, but rather memory blocks 24 employed as OP blocks are shuffled in and out of circulation, which makes it difficult to designate an OP pool 26 as an indicator of memory device failure (breakdown).

The situation is somewhat different in the case of a bad-block management technique implemented on the SSD 10. Bad-block management allows the identification of blocks 24 that develop one problem or another, which can encompass extended programming or erase times, or an increase in the number of errors that have to be corrected by ECC implementation. According to a preferred aspect of the invention, the ability to identify and flag individual blocks can be used as the basis for setting aside blocks that do not contain user or system data, but rather are subjected to simulated data that only serve the purpose of testing the blocks, which in turn can be used to assess the integrity and functionality of other blocks 24 of the memory devices 18 (hereinafter, "data blocks" 24), which can be used in a conventional manner to store data on the device 18. Such test blocks, referred to below as wear-indicator blocks 28, are schematically represented in FIG. 1 as being present in each memory device 18 of the array 16. Specifically, using similar techniques known in the art for flagging blocks within a memory device as bad blocks, blocks within any of the memory devices 18 can be flagged (assigned) as wear-indicator blocks 28 and excluded from use as data blocks by the memory devices 18. As is conventional, for purposes of carrying out wear-leveling on the memory devices 18, the data blocks 24 contain information regarding the number of P/E cycles encountered during their normal usage. The wear-indicator blocks 28 are then accessed by a "test-ahead" procedure performed by the controller 20, which can be based on the average workload (number of P/E cycles) of the SSD 10, to test the integrity and functionality of the wear-indicator blocks 28 and, if performed properly, assess the integrity and functionality of the data blocks 24.

As indicated in FIG. 1, the wear-indicator blocks 28 are part of the same array 16 of memory devices 18 as the data blocks 24 (including blocks 24 within the OP pool 26) of those devices 18, and therefore are subjected to the same environmental parameters, such as temperature and usage frequency, that are important contributing factors for retention and write endurance of NAND flash memory devices. Therefore, independent of external parameters, the wear-indicator blocks 28 are expected to be a reliable indicator for looming failure of the memory devices 18 on the SSD 10 and, as discussed below in more detail, can be used to initiate warning messages, data backup procedures, or any other appropriate action that may be taken with respect to the SSD 10.

Figure 2:
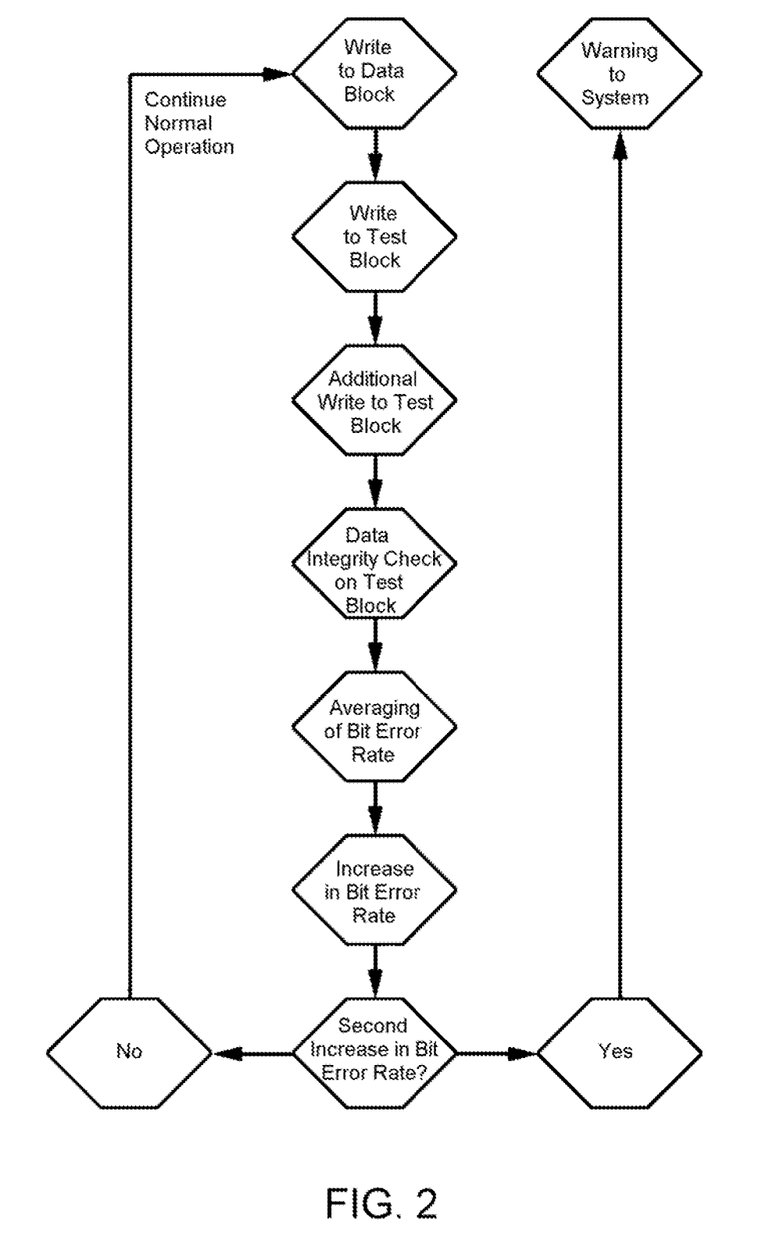
FIG. 2 is a simplified flow chart representing a method of performing failure anticipation using averaging of bit error rates on consecutive accesses of test blocks according to an embodiment of the invention.

FIG. 2 is a simplified flow chart representing a "test-ahead" procedure that uses averaging of bit error rates on consecutive accesses of wear-indicator blocks 28 (referred to as "test blocks" in FIG. 2). The wear-indicator blocks 28 are subjected to program (write), read and erase accesses (P/E cycles) performed by the controller 20 (with or without the assistance of software running in the background, for example, on the system level or through the controller's firmware) according to the information in the wear-leveling data used on the data blocks 24 of the memory device 18. In order to generate relevant data for any incumbent failure of the data blocks 24, FIG. 2 represents the data and wear-indicator blocks 24 and 28 as being subjected to P/E cycles ("writes"), and further represents accesses to the wear-indicator blocks 28 as being increased over the mean number of accesses to the data blocks 24, generally by some non-zero offset value. The wear-indicator blocks 28 are then tested using a standard "data integrity check" procedure of a type commonly performed by NAND controllers (such as the controller 20), such as comparison of checksums or signatures to generate test-ahead data. For example, the controller 20 can use an ECC mechanism to generate a checksum of a data range in the wear-indicator blocks 28 and compare the checksum to subsequent reads of checksums of the same data range. This data can then be monitored by the controller 20 to identify subsequent increases in bit error rates, and in particular unrecoverable bit error rates (UBER) that lead to data loss within the wear-indicator blocks 28. The offset value is preferably predetermined to constitute an adequate buffer so that bit error rates detected in a wear-indicator block 28 can be used to predict failures of the data blocks 24 before they occur during standard operation. The detection of an increase in the rate of bit errors, corresponding to fatigue of a wear-indicator block 28, allows appropriate corrective action to be taken with respect to the memory device 18, for example, the initiation of a data backup procedure. However, a corrective action may not be necessary if the bit error rate does not correspond to an increased number of P/E cycles, for example, due to read disturbs or the erratic nature of P/E errors.

Unlike hard disk drives (HDDs), the write endurance and data retention of the NAND flash memory devices 18 will be influenced by the data pattern written to the array 16. Hard disk drives generally do not care whether a bit is "0" or "1." However, in the case of NAND flash technology, the "polarity" of data is an important factor since 1 is the fully erased state and 0 is the fully programmed state. The erased state does not lose data because of stress-induced leakage current or write/read disturbance. Likewise, if a block is erased, the effect of quantum mechanical tunneling on the oxide layer of cells being already at a "1" level is rather small. On the other hand, cells that are fully programmed (at a "0" level) need to unload the entire electron charge of the floating gate through the oxide layer, which causes the known breaking of atomic bonds within the tunnel oxide proper and at its layer interface. Moreover, programmed cells can lose data over time due to leakage current, which is exacerbated in the case of proximity effects such as the erasure of nearby blocks, causing accelerated loss of data through stress-induced leakage current (SILC).

Particularly in the case of rich media and office software applications, clusters of 0-bits are common, for example in the dark background of still images or movies, and in spaces between characters. In turn, this means that large portions of the workload will constitute a worst case scenario, which can cause accelerated fatigue of individual blocks even if wear leveling is optimally implemented. Therefore, an additional aspect of the invention is to apply a test payload in the form of a predefined pattern that is biased towards a worst case scenario by preferentially writing 0 bit values to the wear-indicator blocks 28. Alternatively, the test payload may by applied in the form of a predefined composite pattern, for example, the controller 20 may preferentially write 0 bit values to one set of wear-indicator blocks 28, write mixed 0 and 1 values to a second set of wear-indicator blocks 28, and preferentially write 1 bit values to a third set of wear-indicator blocks 28. The resulting fatigue-indicator data can then be used individually for the generation of first, second and third-level warnings. Alternatively, such a composite pattern can be rotated over the wear-indicator blocks 28 to simulate a more real usage-related wear indication.

In all instances, in order to anticipate the break point of the SSD 10, the wear-indicator blocks 28 need to be subjected to a higher number of P/E cycles than the number of P/E cycles encountered by the data blocks 24 of the SSD 10. To more realistically represent the actual workload across an entire device 18, data patterns used to generate a higher number of P/E cycles to which the wear-indicator blocks 28 are subjected may also be based on random data samples of the P/E cycles encountered by the data blocks 24 of the SSD 10. In either case, the P/E cycles to which the wear-indicator blocks 28 are subjected may be a multiple of the sampled or average number of P/E cycles to the data blocks 24 of the SSD 10. As a nonlimiting example, a 10% offset can be chosen, irrespective of the absolute number of cycles. In this case, the "test ahead" is independent of the architectural and process idiosyncrasies of the integrated circuits (ICs) used as the memory devices 18, that is, it does not matter whether the device 18 has a typical write endurance of 3000 P/E cycles or 100,000

P/E cycles, the wear rate of the wear-indicator blocks 28 will always presumably be approximately 10% ahead of the data blocks 24.

In addition to or as an alternative to the above, the wear-indicator blocks 28 may be subjected to P/E cycles at some predetermined factory default, such that the wear-indicator blocks 28 of an otherwise new SSD 10 are artificially aged prior to using the SSD 10, for example, using the data blocks 24 for data storage.

Figure 3:
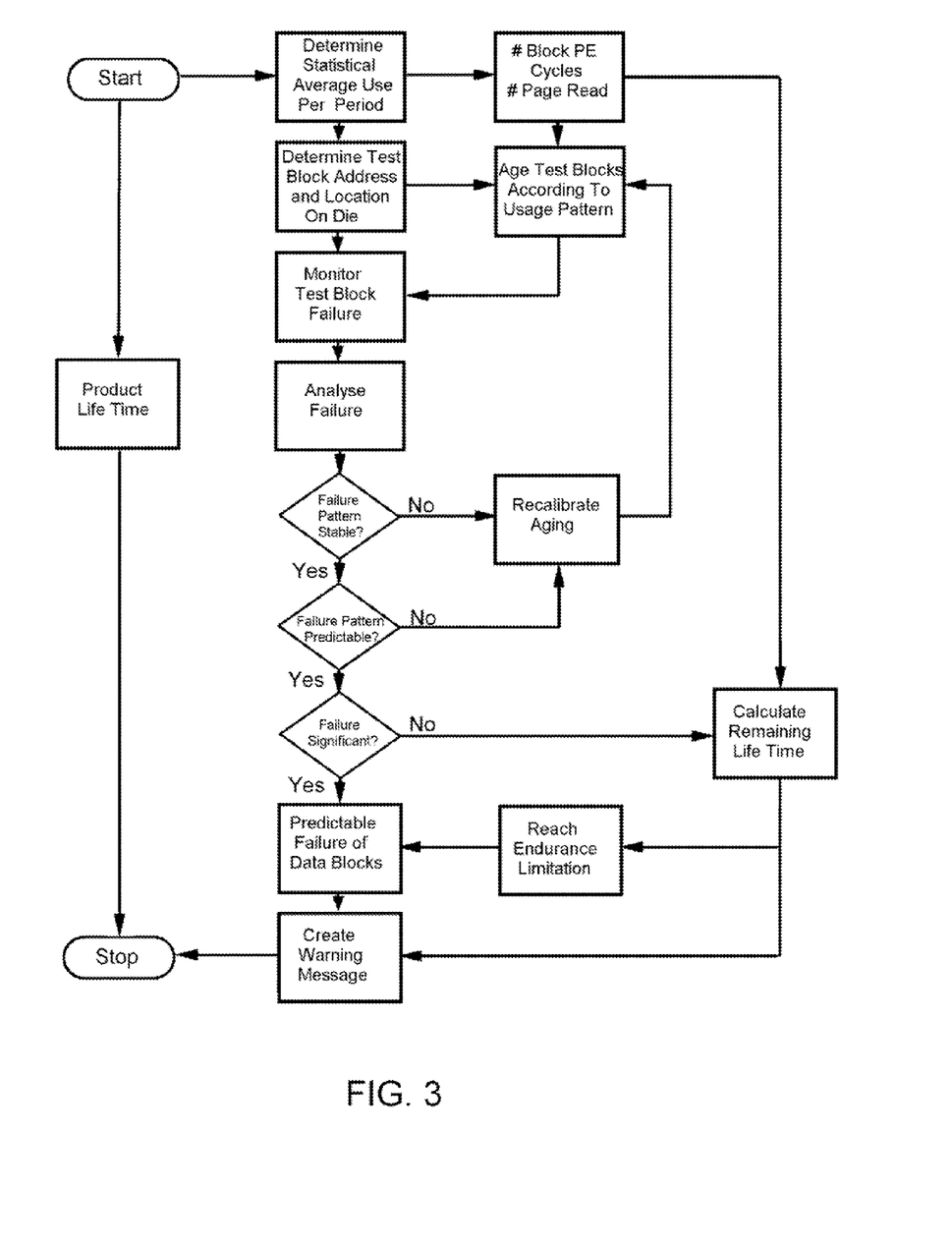
FIG. 3 is a more complex flow chart that represents the inclusion of recalibration of data and deterministic measures for anticipating device failure according to a preferred aspect of the invention.

FIG. 3 represents a flow chart in which some of the above-noted optional aspects of the invention are incorporated, for example, "aging" the wear-indicator ("test") blocks 28 by subjecting them to a number of P/E cycles that is a multiple of the average number of P/E cycles to the data blocks 24 of the SSD 10. FIG. 3 further represents the implementation of a relatively more complex process by which recalibration of data and deterministic measures are included for anticipating memory device breakdown. For example, occurrence of failure at the same address, that is, a "predictable" failure pattern and, by extension, an increase of the address range at which failures occur could be used as an indicator of mechanical wear tied to a specific bit line or word line. Similarities in such patterns over several wear-indicator blocks 28 could then be used as deterministic criteria to capture additional environmental and usage parameters to indicate accelerated fatigue. Alternatively, this kind of failure could be interpreted as a manufacturing flaw that has no bearing on the viability and reliability of the rest of the array. Depending on the specific patterns of failure, additional parameters can be developed to increase the level of warning or else discard the warning as production flaw and consequently retire the block 28 altogether as a bad block while substituting a spare data block 24 as a "new" wear-indicator block 28. Based on empirical data, the failure patterns of wear-indicator blocks 28 can also be used to anticipate the remaining life of the data blocks 24 and, instead of immediately retiring the SSD 10, issue a warning that the SSD 10 has reached an approximate percentage of its anticipated life and that failure will be likely after a predicted remaining life, which may be calculated based on the usage pattern of the SSD 10.

NAND flash bit errors have a tendency to occur spontaneously without recurrence in the subsequent P/E cycles. Therefore, another parameter taken into account in FIG. 3 is whether error rates are "stable" or whether a random peak occurs that is "significant" or otherwise has no real bearing as an indicator for the remaining life span of the NAND flash cells. To address this, error rates or error patterns can also be analyzed over consecutive accesses. For example, a sudden increase may show up during one access but the next access may show a reduced error rate. In this case, the increased error rate of the access during which it occurred is preferably ignored. A relatively easy approach to this is to average a number of consecutive accesses on the wear-indicator blocks 28. In that case, a single spike in error rates would show an increase in the averaged error rate, but after the particular access at which the spike occurred, the error rate would be stable over the entire range including the spike and subsequently again decrease to a lower value.

From the above, it should be appreciated that, by flagging the wear-indicator blocks 28 as indicators of increased bit error rates, and in particular UBER, it is possible to accurately predict the threshold of a fatigue failure in the SSD 10, independent of variations in design and environmental parameters. Such predictability further affords the opportunity to automatically initiate a data backup to local and remote mass storage devices associated with the host system containing the SSD 10. In this respect, the trend towards tiered storage systems becomes significant, for example, standard hard disk drives (HDDs) provide terabyte storage at minimal cost. Such storage devices can be utilized for holding data until a replacement is available for the failing SSD 10, and permits fast but more expensive SSDs to be purchased on an as-needed basis.

Figure 4:
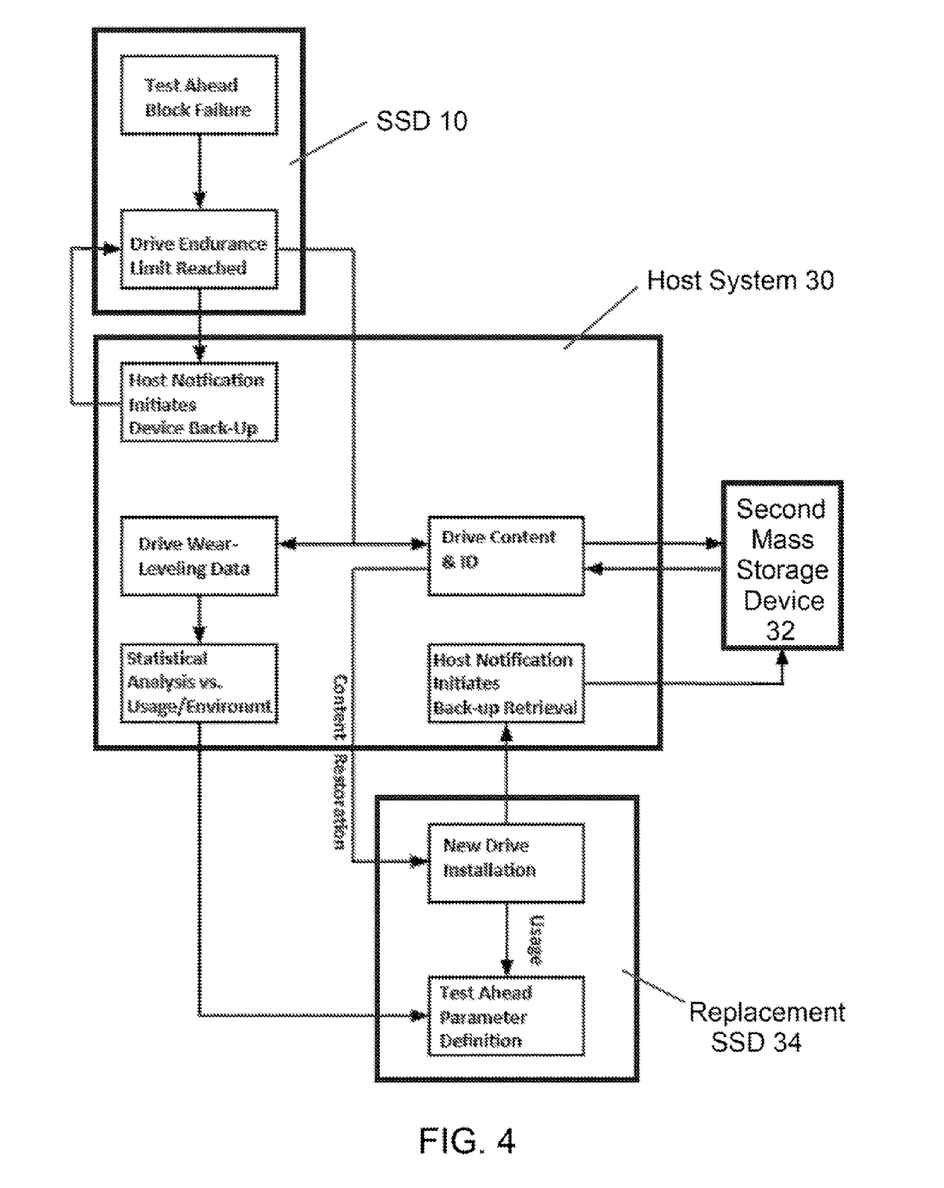
FIG. 4 is a flow chart representing steps that occur if an endurance limitation is reached for a memory device of a solid-state mass storage device, including notification of a host system containing the mass storage device, initiation of data backup to a second (remote or local) mass storage device, and retrieval/decryption and restoration of the data from the second mass storage device to a replacement solid-state mass storage device, including programming of failure anticipation parameters obtained by analyzing wear-leveling data of the original solid-state mass storage device.

As represented in FIG. 4, once a predetermined threshold for the error (failure) rate of any wear-indicator (test-ahead) block 28 has been reached, the SSD 10 notifies its host system 30 that the SSD 10 is approaching its write endurance limitation to allow the host system 30 to initiate a corrective action. According to a preferred aspect of the invention, the corrective action includes backing-up all data from the SSD 10. In addition to actual data (user data) stored on the data blocks 24, the backed-up data may include wear-leveling information obtained from the data blocks 24 and wear-indicator blocks 28 to allow for statistical analysis of the overall write endurance limitation of the SSD 10 in relation to usage patterns and environmental parameters. The backed-up data may also include a code or other information that uniquely identifies the data so that it can be later found and identified within the host system 30. Such information may include drive-specific parameters, including such identifiers as model, serial number and/or volume of the SSD 10, and/or firmware revision. The user data, wear-leveling information and identifiers are stored on a separate mass storage device 32, which may employ any suitable mass storage technology, for example, a hard disk drive (HDD) or solid state technology, including NAND flash-based memory devices. This backup device 32 can either be local, meaning a drive installed in a bay of the host system 30, or remote, meaning a drive wirelessly connected to the host system 30, or within a server intranet containing the host system 30, or connected to the host system 30 through the Internet.

Once the data has been copied from the SSD 10 to the backup device 32 and the host system 30 logs the backup path to the device 32 at the system level, additional corrective actions may be initiated by the host system 30. Under some circumstances, it may be appropriate that the host system 30 generate a request to retire the SSD 10 for use in non-critical applications within the system 30. More preferably, the operation of the SSD 10 is suspended and the host system 30 generates a request for a replacement of the SSD 10, preferably with a compatible replacement SSD 34, in other words, an SSD 34 that can simply be installed within the host system 30 in place of the original SSD 10 due to its use of the same interface technology (ATA, SAT, SCSI, SAS, USB 2.0, USB 3.0, Gigabit-Ethernet, etc.). As soon as the compatible SSD 34 is installed, the system 30 preferably detects the SSD 34 and automatically initiates retrieval of the backed-up data from the backup device 32 and stores the data on the SSD 34. In addition, the wear-leveling information from the original SSD 10 and/or statistical analysis performed on this information can be used to define and fine tune the test-ahead parameters of the replacement SSD 34.

The code or other information that uniquely identifies the data copied from the SSD 10 can be used to enable the replacement SSD 34 to access to the backed-up data as soon as the SSD 34 is installed. The replacement SSD 34 can be programmed with the last file image of the previous drive's data and activated for immediate usage. The data image can be encrypted with a unique ID and an individual signature, predetermined by the user, to protect the data content and to provide privacy. To further protect the privacy of the data, the host system 30 may destroy the data image if no further contractual obligations are in place to keep the image alive for an extended period of time. In order to avoid a failure of the data restoration to the replacement SSD 34, a signature exchange between the SSD 34 and the backup device 32 can be used to communicate the permission to destroy the data on the backup device 32. A user-required interaction to place the replacement SSD 34 in operation with the confirmation of a local backup could trigger the remote file image destruction. This would avoid a very large redundancy capacity and free up the backup device 32 for reuse in the event of another SSD failure within the host system 30.

From the above, it should be appreciated that fatigue detected with the test-ahead procedure described can provide a buffer between and the amount of wear that serves as a threshold for initiating data backup to the second mass storage device 32 and the amount of wear that would have resulted in failure of the SSD 10. As such, corrective actions taken by the test-ahead can be used to signal an expected increase of failures in the host system 30 as a statistically meaningful and significant indicator of predicted total sudden failure. In this manner, data integrity can be achieved on the media level and data coherency can be achieved on the system level.

The ages of different drives will typically vary within the host system 30, in which case the system 30 may utilize the wear-leveling information and/or statistical analysis obtained from the original SSD 10 to predict failures and possibly other potential problems with other mass storage devices in the system 30. Deviations identified for individual devices can be used to provide an additional layer of safety for the prevention of data loss within the host system 30, and/or used to optimize operating conditions in order to increase write endurance and data retention. It is understood that a cross-device extrapolation of data will be most meaningful if the same or at least similar devices are used, which includes the same ICs and similar firmware-based implementations of TRIM and garbage collection routines.

Host systems containing multiple drives and utilizing the test-ahead procedure described above can further benefit from having SSDs of different ages in order to generate a staggered age array of storage media. The presence of SSDs of different ages within the host system 30 will further increase the ability to predetermine and predict failures based on data collected from older SSDs, whose write endurance data can be extrapolated to predict the behavior of younger SSDs in the system 30. Accordingly, another aspect of the invention is the ability to collect data obtained from failed SSDs of the system 30 in a system-level database and use the data to correlate the failure information over a larger population of SSDs in the system 30. With this database, the failure behavior of any particular SSD can be correlated to determine the likelihood that the particular SSD is failing. This capability is extremely useful to individuals and storage system operators who rely on the integrity of data stored on SSDs.

While the invention has been described in terms of particular embodiments, it is apparent that other forms could be adopted by one skilled in the art. Furthermore, though certain components are shown and preferred for the test-ahead procedure of this invention, it is foreseeable that functionally-equivalent components could be used or subsequently developed to perform the intended functions of the disclosed components. Therefore, the scope of the invention is to be limited only by the following claims.

The invention claimed is:

1. A method for automatic backup of a first solid-state mass storage device of a host system by predetermining a failure of the first solid-state mass storage device, the first solid-state mass storage device comprising a controller and at least one nonvolatile memory device comprising pages that are organized into memory blocks, the method comprising:

assigning at least a first memory block of the memory blocks as wear indicator means and excluding the wear indicator means from use as data storage for the nonvolatile memory device;

using at least a first set of the memory blocks of the nonvolatile memory device as data blocks for data storage whereby data are written to and erased from each of the data blocks in program/erase (P/E) cycles;

collecting information regarding the number of P/E cycles encountered by the data blocks and accessing the information to perform wear leveling on the data blocks;

subjecting the wear indicator means to P/E cycles so that the wear indicator means is subjected to a number of P/E cycles that is greater than the number of P/E cycles encountered by the data blocks;

performing integrity checks of the wear indicator means and monitoring a bit error rate thereof; and taking corrective action if the bit error rate of the wear indicator means reaches a predetermined threshold, the corrective action comprising connecting the first solid-state mass storage device to a second mass storage device of the host system, and then initiating a data backup procedure comprising copying data stored in the data blocks of the first solid-state mass storage device to the second mass storage device.

2. The method of claim 1, further comprising assigning at least a second set of the memory blocks of the nonvolatile memory device as over-provisioned memory blocks for the nonvolatile memory device, and excluding the wear indicator means from the over-provisioned memory blocks.

3. The method of claim 1, wherein the corrective action further comprises suspending operation of the first solid-state mass storage device after completion of the data backup procedure.

4. The method of claim 1, wherein after completion of the data backup procedure, the corrective action further comprises the host system generating a request to replace the first solid-state mass storage device with a compatible solid-state mass storage device.

5. The method of claim 4, wherein the corrective action further comprises identifying the data copied from the first solid-state mass storage device with at least one identifier.

6. The method of claim 5, wherein the identifier comprises an identification of the first solid-state mass storage device.

7. The method of claim 5, further comprising replacing the first solid-state mass storage device with the compatible solid-state mass storage device, and then using the identifier of the first solid-state mass storage device to enable the compatible solid-state mass storage device to access and recover the backed-up data from the second mass storage device as soon as the compatible solid-state mass storage device is installed.

8. The method of claim 1, wherein the first solid-state mass storage device is a NAND flash memory device.

9. The method of claim 1, wherein the second mass storage device is local to the first solid-state mass storage device.

10. The method of claim 1, wherein the second mass storage device is remote from the first solid-state mass storage device.

11. The method of claim 1, wherein the second mass storage device is a hard disk drive.

12. The method of claim 1, wherein the second mass storage device is a solid-state mass storage device.

13. The method of claim 1, wherein the data backup procedure further comprises copying wear-leveling information obtained from the data blocks and the wear indicator means of the first solid-state mass storage device, the method further comprising performing a statistical analysis of the wear-leveling information to identify a write endurance limitation of the first solid-state mass storage device.

14. The method of claim 13, further comprising using the statistical analysis to predict failures of other solid-state mass storage devices within the host system.

15. A computer host system adapted to perform an automatic backup of a first solid-state mass storage device to a second mass storage device by predetermining a failure of the first solid-state mass storage device;

the first solid-state mass storage device comprising:
  a controller;
  at least one nonvolatile memory device comprising pages that are organized into memory blocks, at least a first memory block of the memory blocks assigned as wear indicator means that is excluded from use as data storage for the nonvolatile memory device, and at least a first set of the memory blocks of the nonvolatile memory device used as data blocks for data storage whereby data are written to and erased from each of the data blocks in program/erase (P/E) cycles;
  means for performing wear leveling to maintain substantially the same level of usage across the data blocks;
  means for subjecting the wear indicator means to P/E cycles so that the wear indicator means is subjected to a number of P/E cycles that is greater than the number of P/E cycles encountered by the data blocks; and
  means for performing integrity checks of the wear indicator means and monitoring a bit error rate thereof;
the computer host system comprising means for taking corrective action if the bit error rate of the wear indicator means reaches a predetermined threshold, the corrective action means operating to connect the first solid-state mass storage device to the second mass storage device and then initiate a data backup procedure that comprises copying to the second mass storage device all data stored in the data blocks of the first solid-state mass storage device.

16. The computer host system of claim 15, wherein the first solid-state mass storage device further comprises at least a second set of the memory blocks of the nonvolatile memory device assigned as over-provisioned memory blocks for the nonvolatile memory device, and the wear indicator means are excluded from the over-provisioned memory blocks.

17. The computer host system of claim 15, wherein the corrective action means further operates to suspend operation of the first solid-state mass storage device after completion of the data backup procedure.

18. The computer host system of claim 15, wherein the corrective action means further operates to generate a request to replace the first solid-state mass storage device with a compatible solid-state mass storage device after completion of the data backup procedure.

19. The computer host system of claim 15, wherein the corrective action means further operates to identify the data copied from the first solid-state mass storage device with at least one identifier.

20. The computer host system of claim 15, wherein the first solid-state mass storage device is a NAND flash memory device.

21. The computer host system of claim 15, wherein the second mass storage device is local to the first solid-state mass storage device.

22. The computer host system of claim 15, wherein the second mass storage device is remote from the first solid-state mass storage device.

23. The computer host system of claim 15, wherein the second mass storage device is a hard disk drive.

24. The computer host system of claim 15, wherein the controller of the first solid-state mass storage device comprises the wear-leveling performing means, the subjecting means, and the integrity check performing means.

25. The computer host system of claim 15, further comprising wear-leveling information obtained from the data blocks and the wear indicator means of the first solid-state mass storage device and on which statistical analysis can be performed to identify a write endurance limitation of the first solid-state mass storage device.

* * * * *